(12) United States Patent  (10) Patent No.: US 7,829,986 B2
Lee et al.  (45) Date of Patent: Nov. 9, 2010

(54) INTEGRATED CIRCUIT PACKAGE SYSTEM WITH NET SPACER

(75) Inventors: Sang-Ho Lee, Kyounggi (KR); Jong-Woo Ha, Seoul (KR); Soo-San Park, Seoul (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 11/278,411

(22) Filed: Apr. 1, 2006

(65) Prior Publication Data

US 2007/0235846 A1 Oct. 11, 2007

(51) Int. Cl.
*H01L 23/495* (2006.01)
(52) U.S. Cl. .............. 257/676; 257/E25.013; 257/686; 257/777; 438/108
(58) Field of Classification Search .......... 257/E25.013, 257/E21.705, E21.502, 676, 777, 784, 786, 257/712, 685, 686, 723, 724; 438/108, 109
See application file for complete search history.

(56) References Cited

U.S. PATENT DOCUMENTS

| 5,323,060 | A | 6/1994 | Fogal et al. | |
|---|---|---|---|---|
| 5,904,497 | A * | 5/1999 | Akram | 438/106 |
| 6,472,758 | B1 | 10/2002 | Glenn et al. | |
| 6,569,709 | B2 | 5/2003 | Derderian | |
| 6,627,990 | B1 * | 9/2003 | Shim et al. | 257/712 |
| 6,716,676 | B2 * | 4/2004 | Chen et al. | 438/122 |
| 6,737,750 | B1 * | 5/2004 | Hoffman et al. | 257/777 |
| 6,818,978 | B1 * | 11/2004 | Fan | 257/686 |
| 6,828,665 | B2 | 12/2004 | Pu et al. | |
| 6,838,761 | B2 * | 1/2005 | Karnezos | 257/685 |
| 6,841,858 | B2 * | 1/2005 | Shim et al. | 257/676 |
| 6,919,631 | B1 * | 7/2005 | Hoffman et al. | 257/707 |
| 6,952,047 | B2 * | 10/2005 | Li | 257/678 |
| 6,956,284 | B2 | 10/2005 | Cady et al. | |
| 6,962,865 | B2 | 11/2005 | Hanaoka et al. | |
| 6,964,915 | B2 | 11/2005 | Farnworth et al. | |
| 6,965,160 | B2 | 11/2005 | Cobbley et al. | |
| 6,977,439 | B2 | 12/2005 | Kang et al. | |
| 7,205,651 | B2 * | 4/2007 | Do et al. | 257/706 |
| 2003/0038357 | A1 | 2/2003 | Derderian | |
| 2003/0062628 | A1 * | 4/2003 | Lee et al. | 257/777 |
| 2003/0164549 | A1 * | 9/2003 | Nakayama | 257/777 |
| 2004/0183180 | A1 * | 9/2004 | Chung et al. | 257/686 |
| 2005/0133932 | A1 | 6/2005 | Pohl et al. | |
| 2005/0230800 | A1 * | 10/2005 | Do et al. | 257/686 |

\* cited by examiner

*Primary Examiner*—Chris Chu
(74) *Attorney, Agent, or Firm*—Mikio Ishimaru

(57) ABSTRACT

A method for manufacturing an integrated circuit package system is provided including: forming a strip level net spacer including support bars, tie bars and paddles; configuring the support bars, the tie bars and the paddles to form four or more open regions around each of the paddles; and interconnecting the support bars, the tie bars and the paddles to provide structural support to vertically stacked semiconductor devices formed above first semiconductor devices and directly attached to the paddles.

20 Claims, 7 Drawing Sheets

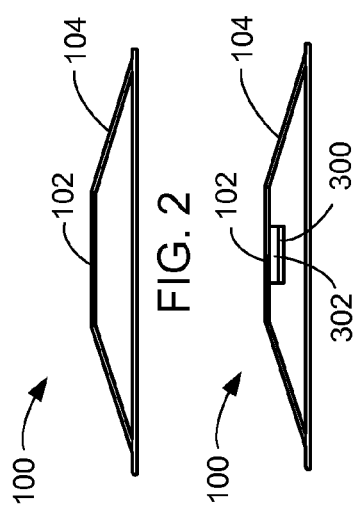
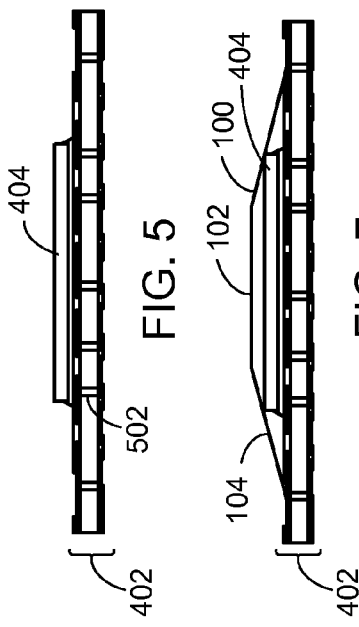
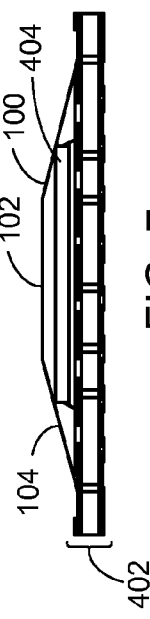
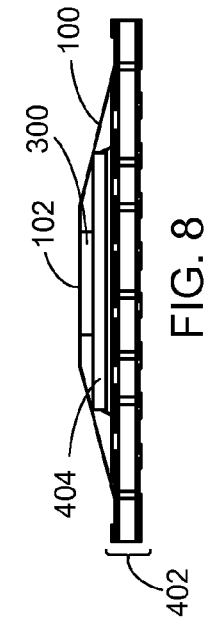
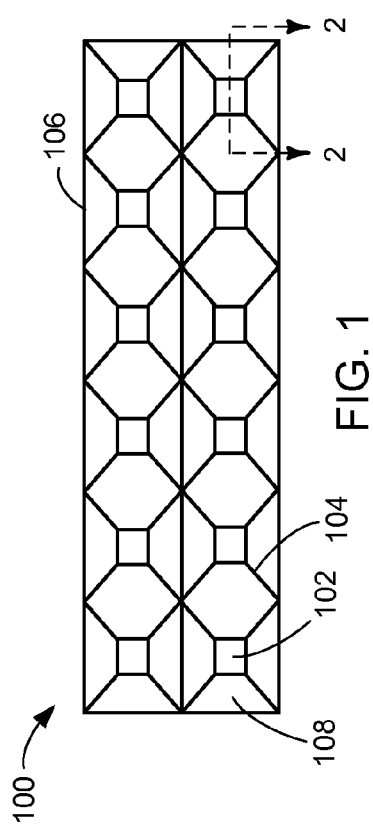
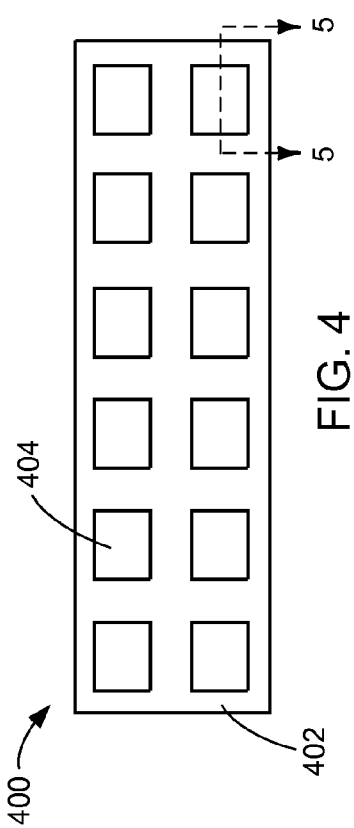
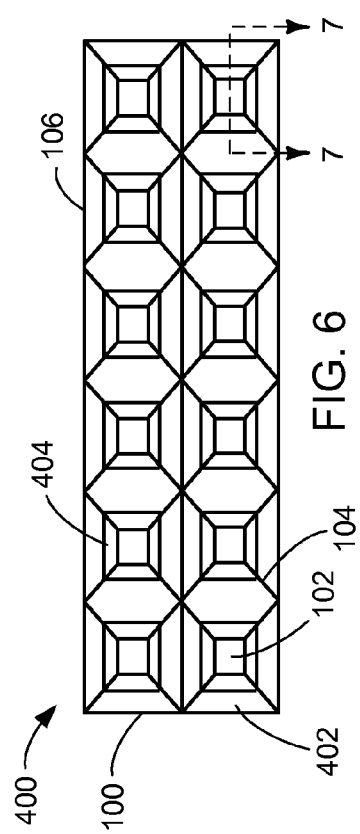

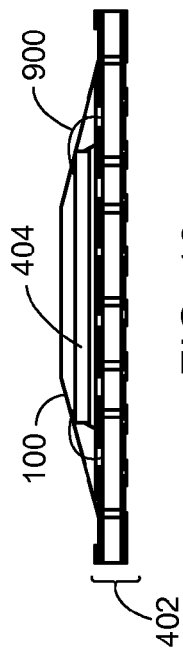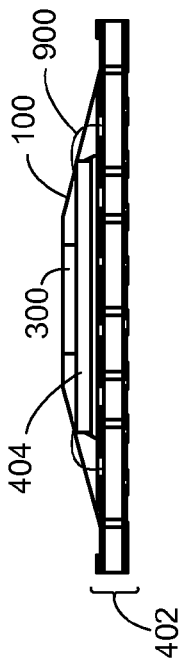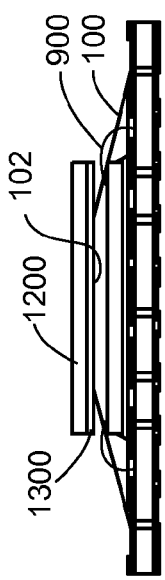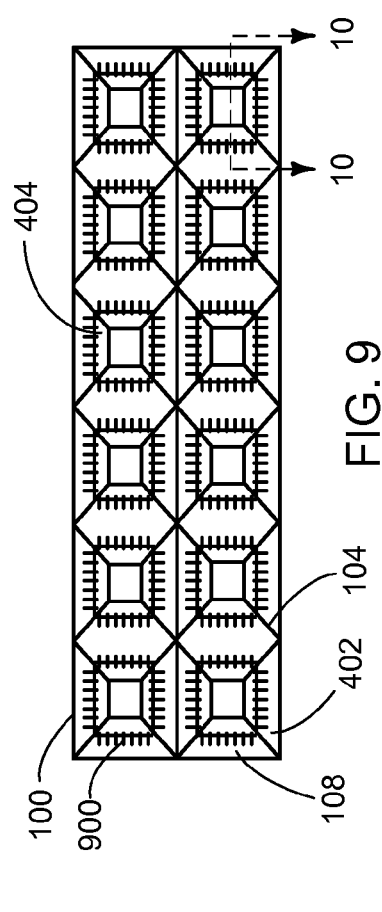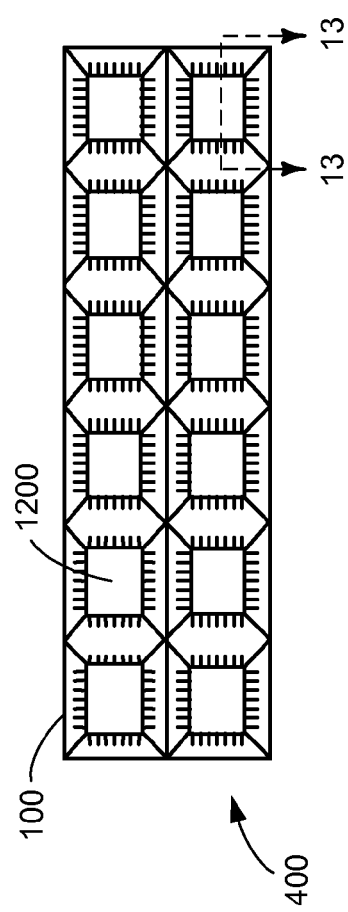

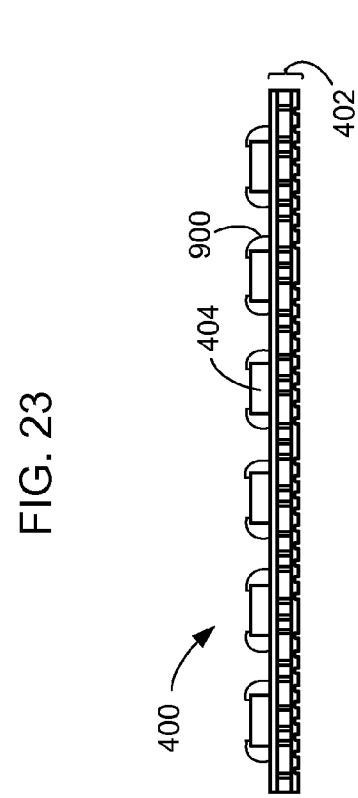
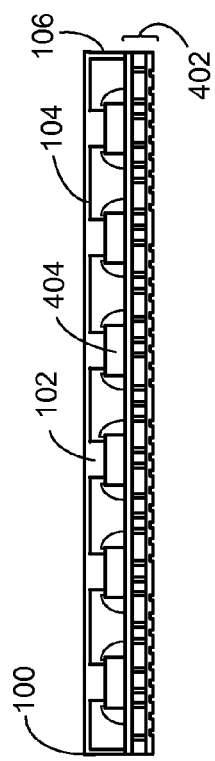
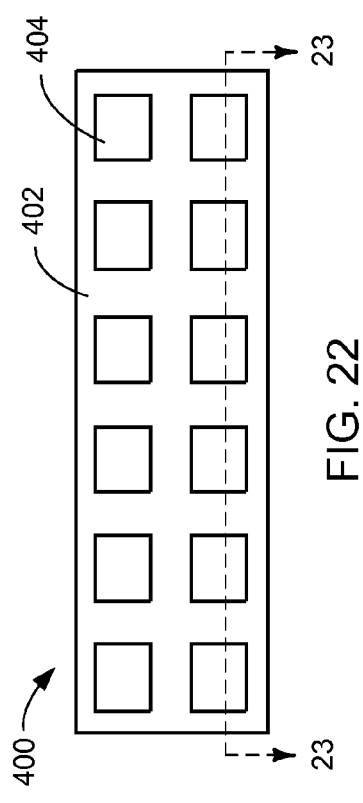
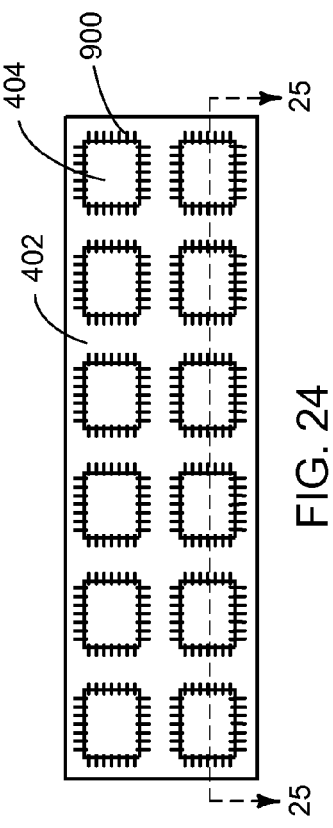
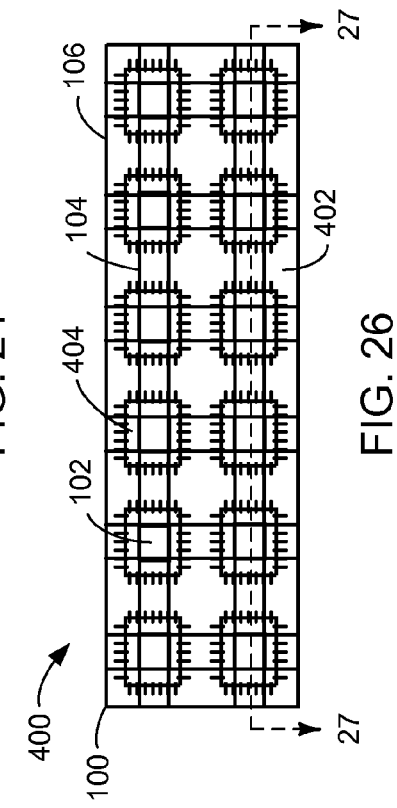
FIG. 22  FIG. 23  FIG. 24  FIG. 25  FIG. 26  FIG. 27

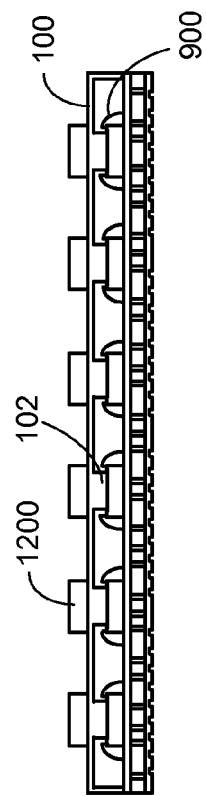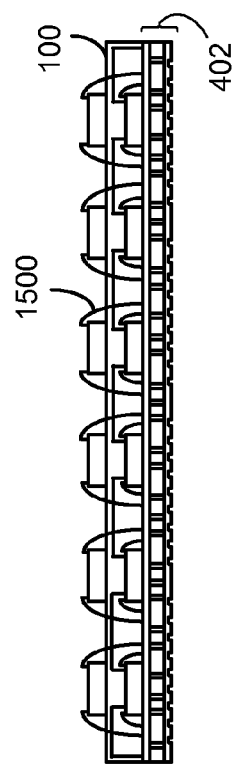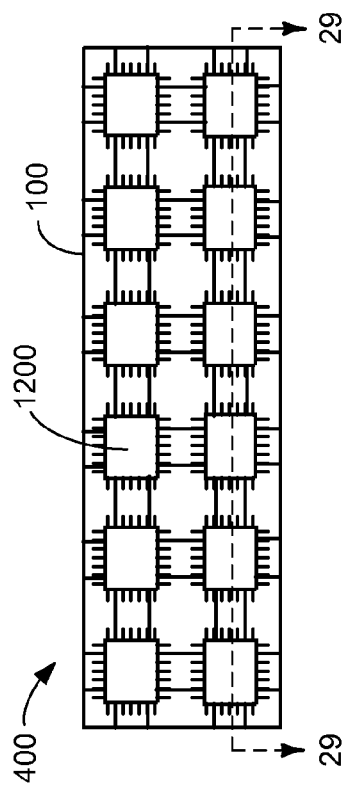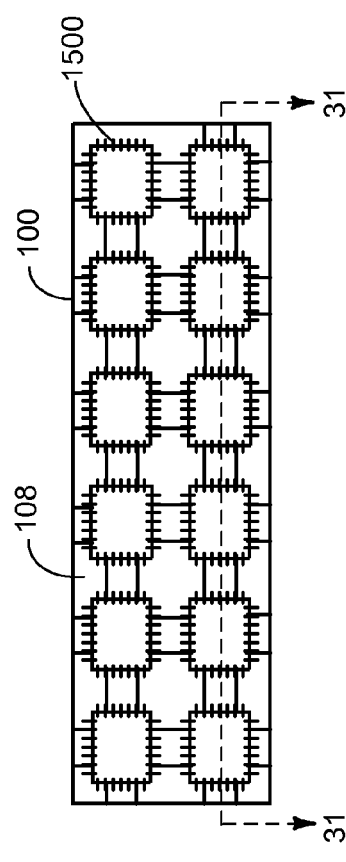
FIG. 28
FIG. 29
FIG. 30
FIG. 31

INTEGRATED CIRCUIT PACKAGE SYSTEM
WITH NET SPACER

CROSS-REFERENCE TO RELATED APPLICATION(S)

The present application contains subject matter related to co-pending U.S. patent application Ser. No. 11/307,382 filed Feb. 3, 2006. The related application is assigned to STATS ChipPAC Ltd. and is herein incorporated by reference thereto.

TECHNICAL FIELD

The present invention relates generally to integrated circuits, and more particularly to integrated circuit package systems.

BACKGROUND ART

Integrated circuits are what power many of today's consumer electronics, for instance, cellphones, video cameras, portable music players, computers, etc. As customer demand improves integrated circuit performance, faster, more reliable, and higher-density circuits, need to be produced at a lower cost. Packaging goals of the future for these integrated circuits will be met by increasing the density of chips while reducing the number of internal electrical interconnections. Packaging with fewer interconnects can potentially shorten the circuit length, decreases potential failure points, reduce circuit resistance, and reduce inter-line capacitance or cross-talk. Various techniques, such as, flip chip, gall grid array (BGA), chip on board (COB), and multi-chip modules (MCM), have been developed to meet the continued demands for improving integrated circuit system performance.

For even higher density applications, package assemblies including stacked die configurations have been employed. Unfortunately, many of these applications still suffer from bulky configurations, substrate warpage, electrical shorting, alignment difficulties, delamination, and chip floating problems due to low viscosity adhesives.

Thus, a need still remains for a stacked device integrated circuit package system, which, reduces fabrication complexities and provides a low cost alternative to previous methodologies. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method for manufacturing an integrated circuit package system including: forming a strip level net spacer including support bars, tie bars and paddles; configuring the support bars, the tie bars and the paddles to form four or more open regions around each of the paddles; and interconnecting the support bars, the tie bars and the paddles to provide structural support to vertically stacked semiconductor devices formed above first semiconductor devices and directly attached to the addles.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 1 is a top view of a strip level net spacer in accordance with an embodiment of the present invention;

FIG. 2 is a cross-sectional view of FIG. 1 along line 2-2 in accordance with an embodiment of the present invention;

FIG. 3 is the structure of FIG. 2 in accordance with another embodiment of the present invention;

FIG. 4 is a top view of an integrated circuit package system in accordance with an embodiment of the present invention;

FIG. 5 is a cross-sectional view of FIG. 4 along line 5-5 in accordance with an embodiment of the present invention;

FIG. 6 is the structure of FIG. 4 after the formation of the strip level net spacer;

FIG. 7 is a cross-sectional view of FIG. 6 along line 7-7 in accordance with an embodiment of the present invention;

FIG. 8 is the structure of FIG. 7 in accordance with another embodiment of the present invention;

FIG. 9 is the structure of FIG. 6 after wire bonding of the first semiconductor devices;

FIG. 10 is a cross-sectional view of FIG. 9 along line 10-10 in accordance with an embodiment of the present invention;

FIG. 11 is the structure of FIG. 10 in accordance with another embodiment of the present invention;

FIG. 12 is the structure of FIG. 9 after second semiconductor devices are formed over the strip level net spacer;

FIG. 13 is a cross-sectional view of FIG. 12 along line 13-13 in accordance with an embodiment of the present invention;

FIG. 14 is the structure of FIG. 13 in accordance with another embodiment of the present invention;

FIG. 22 is a top view of the integrated circuit package system in accordance with an embodiment of the present invention;

FIG. 23 is a cross-sectional view of FIG. 22 along line 23-23 in accordance with an embodiment of the present invention;

FIG. 24 is the structure of FIG. 22 after wire bonding of the first semiconductor devices;

FIG. 25 is a cross-sectional view of FIG. 24 along line 25-25 in accordance with an embodiment of the present invention;

FIG. 26 is the structure of FIG. 24 after the formation of the strip level net spacer;

FIG. 27 is a cross-sectional view of FIG. 26 along line 27-27 in accordance with an embodiment of the present invention;

FIG. 28 is the structure of FIG. 26 after the second semiconductor devices are formed over the strip level net spacer;

FIG. 29 is a cross-sectional view of FIG. 28 along line 29-29 in accordance with an embodiment of the present invention;

FIG. 30 is the structure of FIG. 28 after formation of the second wire bonds;

FIG. 31 is a cross-sectional view of FIG. 30 along line 31-31 in accordance with an embodiment of the present invention;

BEST MODE FOR CARRYING OUT THE INVENTION

Figure 15:
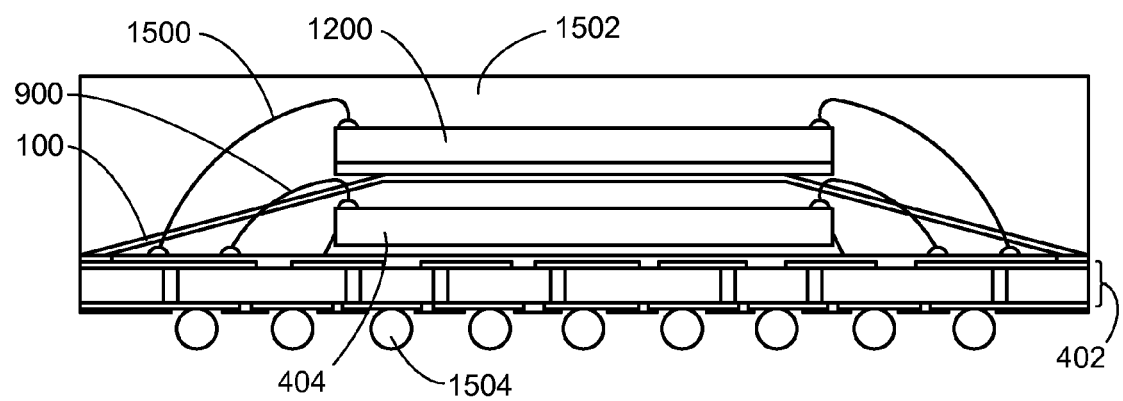
FIG. 15 is the structure of FIG. 13 after the formation of second wire bonds, encapsulation material, and external electrical contacts in accordance with an embodiment of the present invention.

The following embodiments are described in sufficient detail to enable those skilled in the art to make and use the invention, and it is to be understood that other embodiments would be evident based on the present disclosure and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the invention are semi-diagrammatic and not to scale and, particularly, some of the dimensions are for the clarity of presentation and are shown exaggerated in the drawing FIGs. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the plane or surface of a substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

The present invention relates generally to semiconductor packaging employing a strip level net spacer between stacked die or packages. The strip level net spacer is a discrete mesh-like cage structure, including one or more paddles, tie bars, and support bars, that overlays a substrate, thereby providing a resilient platform for mounting vertically stacked die or packages. The strip level net spacer of the present invention has many advantages.

For example, the strip level net spacer can reduce the overall stack-up height of a package, when compared to conventional stacking methods employing dummy spacer chips. The strip level net spacer also eliminates process steps by consolidating individual unit level spacer attach process steps into a single step strip level net spacer attach process. By eliminating costly time consuming process steps, the single step strip level net spacer attach process reduces production time and cost. Additionally, the strip level net spacer helps to prevent substrate or package warpage failure by adding supplementary support to the structure.

Embodiment One

FIGS. 1-16 depict an embodiment of the invention wherein tie bars of the strip level net spacer interconnect paddles and support bars, which reside in different planes.

Referring now to FIG. 1, therein is shown a top view of a strip level net spacer 100 in accordance with an embodiment of the present invention. The strip level net spacer 100 includes paddles 102, tie bars 104, support bars 106, and open regions 108. The paddles 102 are formed above the plane of the support bars 106 and are connected to the support bars 106 by the tie bars 104. In an embodiment, each of the paddles 102 may include four (4) of the open regions 108 formed around each of the paddles 102, wherein each of the open regions 108 is bounded, in part, by the tie bar 104 and the paddles 102. Generally, the support bars 106 can be arranged to bound, in part less than all of the open regions 108. The open regions 108 provide space for electrical interconnections, such as wire bonds, described further below.

The strip level net spacer 100 can be formed of a plastic material or of a thermally conducting material for purposes of heat dissipation.

Referring now to FIG. 2, therein is shown a cross-sectional view of FIG. 1 along line 2-2 in accordance with an embodiment of the present invention. The strip level net spacer 100 includes the paddles 102 and the tie bars 104. The tie bars 104 are connected to the support bars 106 (not shown) for structural support.

Referring now to FIG. 3, therein is shown the structure of FIG. 2 in accordance with another embodiment of the present invention. The strip level net spacer 100 includes the paddles 102, the tie bars 104 and an adhesive layer 300. Just as with FIG. 2, the tie bars 104 are connected to the support bars 106 (not shown) for structural support. Furthermore, the adhesive layer 300 is applied to an optional projection 302 on the bottom of the paddle 102. The adhesive layer 300 may include, by way of example and not by way of limitation, an epoxy, thermoplastic material or a tape.

FIGS. 4-17 depict an exemplary process flow for the manufacture of an integrated circuit package system employing the strip level net spacer 100 in accordance with an embodiment of the present invention. It is to be understood that FIGS. 4-17 depict by way of example and not by limitation, an exemplary process flow for the formation of an integrated circuit package system, and it is not to be construed as limiting.

Referring now to FIG. 4, therein is shown a top view of an integrated circuit package system 400 in accordance with an embodiment of the present invention. The integrated circuit package system 400 includes a substrate 402 and first semiconductor devices 404. The substrate 402 can be fabricated from ceramics, silicon, silicon based composites, plastics, or laminates of various types (organic or inorganic), which are compatible chemically, thermally, and mechanically with the process conditions chosen for the integrated circuit package system 400 design. As an exemplary illustration, the substrate 402 may include multi-chip modules.

The first semiconductor devices 404 may include semiconductor chips and integrated circuit packages selected from active components, passive components, surface mount components, stacked components, and so forth, in numerous configurations and arrangements as may be needed.

By way of example and not by way of limitation, the first semiconductor devices 404 may more specifically include quad-flat non-leaded packages, wire bond packages, single and dual-side memory packages, internal stacking module packages, flip-chip packages, modular packages, application-specific-integrated-circuit (ASIC) packages, stacked die packages or a combination thereof. Furthermore, the first semiconductor devices 404 may further include, by way of example and not by way of limitation, wire bond die, flip-chip die, stacked die, modular die, ASIC die, passive devices or a combination thereof.

Additionally, the present invention includes semiconductor package configurations, such as package-in-package (PiP) and package-on-package configurations (PoP). The PiP system is a 3D package system that stacks a fully tested Internal Stacking Module (ISM) on top of a Base Assemble Package (BAP) to form a single Chip Scale Package (CSP). PoP is a 3D package in which fully tested packages are stacked on top of another single or stacked package during the board mount process. For example, the first semiconductor devices 404 may include PiP and PoP configurations. Additionally, the strip level net spacer 100 of the present invention can be placed between stacked PiP and PoP configurations or within PiP and PoP configurations.

It is to be understood that the first semiconductor devices 404 of the present invention cover a wide range of package and die configurations, and the type of package or die configuration employed is only limited by the design specifications of the integrated circuit package system 400.

Furthermore, it should be noted that the present invention allows for testing of the first semiconductor devices 404 before adhering them to the substrate 402, therefore ensuring the use of known good die or packages in the manufacturing process. Additionally, after adhering the first semiconductor devices 404 to the substrate 402, these multi-chip modules/sub-assemblies can also be tested before incorporation into the integrated circuit package system 400. This ensures that the integrated circuit package system 400 includes known good sub-assemblies, and thereby improves the assembly process yield for packaging.

Referring now to FIG. 5, therein is shown a cross-sectional view of FIG. 4 along line 5-5 in accordance with an embodiment of the present invention. The cross-sectional view depicts the first semiconductor device 404 formed over the substrate 402. Electrical conduits 502 provide electrical interconnection between the substrate 402 and the first semiconductor device 404, with external electrical circuitry.

Referring now to FIG. 6, therein is shown the structure of FIG. 4 after the formation of the strip level net spacer 100. The integrated circuit package system 400 includes the strip level net spacer 100, the substrate 402 and the first semiconductor devices 404. The strip level net spacer 100 overlies the substrate 402, with the paddles 102 substantially centered over each of the first semiconductor devices 404. The support bars 106 rest on the top surface of the substrate 402 and provide structural integrity to the paddles 102 through the tie bars 104. Additionally, the strip level net spacer 100 lends structural support to the substrate 402, thereby preventing warpage of the substrate 402 during subsequent processing.

Advantageously, the strip level net spacer 100 provides a cage-like structure that can not only overlay a multitude of substrates but can overlay a multitude of substrates in a single processing step. Consequently, the strip level net spacer 100 provides a fast and economical structural support mechanism for vertically stacked semiconductor devices.

Referring now to FIG. 7, therein is shown a cross-sectional view of FIG. 6 along line 7-7 in accordance with an embodiment of the present invention. The cross-sectional view more specifically depicts the configuration of the strip level net spacer 100. Per this view, it becomes readily apparent that the paddle 102 is formed above the plane of the substrate 402, as well as above the first semiconductor device 404. The tie bars 104 extend outward and downward from the paddle 102 and contact the support bars 106 (not shown), which overlie the substrate 402. The strip level net spacer 100 can be attached to the substrate 402 by adhesive techniques well known within the art and are not repeated herein.

Referring now to FIG. 8, therein is shown the structure of FIG. 7 in accordance with another embodiment of the present invention. Just as with FIG. 7, the strip level net spacer 100 is formed over the substrate 402. However, the present embodiment includes the adhesive layer 300 formed on the bottom of the paddle 102 for connection to the first semiconductor device 404. Although not shown, the optional projection 302 can help to minimize the amount of the adhesive layer 300 required to secure and fill the gap between the first semiconductor device 404 and the strip level net spacer 100.

The adhesive layer 300 attaches the strip level net spacer 100 to the first semiconductor device 404. The adhesive layer 300 is designed to help support the strip level net spacer 100 from forces encountered during subsequent device attachment or electrical interconnection, such as wire bonding.

Referring now to FIG. 9, therein is shown the structure of FIG. 6 after wire bonding of the first semiconductor devices 404. The open regions 108 of the strip level net spacer 100 allow for the formation of first wire bonds 900, whose size and number are only currently limited by the technology of wire bond equipment and the minimum required operating space. Notably, the spacing of the tie bars 104 permits the placement of the first wire bonds 900 after the strip level net spacer 100 has been adhered to the substrate 402. Alternatively, the first wire bonds 900 could be formed before adhering the strip level net spacer 100 to the substrate 402.

Although FIG. 9 depicts the first semiconductor devices 404 connected to the substrate 402 by the first wire bonds 900, the invention is not to be limited to such electrical interconnection. For instance, the first semiconductor devices 404 may be attached to the substrate 402 by flip-chip methods, ball-grid array technology, or other well known surface mount techniques.

Referring now to FIG. 10, therein is shown a cross-sectional view of FIG. 9 along line 10-10 in accordance with an embodiment of the present invention. The first wire bonds 900 pass through the open regions 108 (not shown) of the strip level net spacer 100 and electrically attach the substrate 402 to the first semiconductor device 404.

Referring now to FIG. 11, therein is shown the structure of FIG. 10 in accordance with another embodiment of the present invention. The first wire bonds 900 pass through the open regions 108 (not shown) of the strip level net spacer 100 and electrically attach the substrate 402 to the first semiconductor device 404. Additionally, the first semiconductor device 404 is attached to the strip level net spacer 100 via the adhesive layer 300.

Referring now to FIG. 12, therein is shown the structure of FIG. 9 after second semiconductor devices 1200 are formed over the strip level net spacer 100. The second semiconductor devices 1200 are stacked vertically over the first semiconductor devices 404 (not shown). More specifically, the second semiconductor devices 1200 are directly attached to the paddles 102 (not shown) formed over the first semiconductor devices 404 by adhesive materials that are well known within the art. The strip level net spacer 100 provides a stable platform for the second semiconductor devices 1200, which prevents delamination and chip cracking problems.

The second semiconductor devices 1200 may include semiconductor chips and integrated circuit packages selected from active components, passive components, surface mount components, stacked components, and so forth, in numerous configurations and arrangements as may be needed.

By way of example and not by way of limitation, the second semiconductor devices 1200 may more specifically include quad-flat non-leaded packages, wire bond packages, single and dual-side memory packages, internal stacking module packages, flip-chip packages, modular packages, application-specific-integrated-circuit (ASIC) packages, stacked die packages or a combination thereof. Furthermore, the second semiconductor devices 1200 may further include, by way of example and not by way of limitation, wire bond die, flip-chip die, stacked die, modular die, ASIC die, passive devices or a combination thereof.

Additionally, the present invention includes semiconductor package configurations, such as package-in-package (PiP) and package-on-package configurations (PoP). The PiP system is a 3D package system that stacks a fully tested Internal Stacking Module (ISM) on top of a Base Assemble Package (BAP) to form a single Chip Scale Package (CSP). PoP is a 3D package in which fully tested packages are stacked on top of another single or stacked package during the board mount process. For example, the second semiconductor devices 1200 may include PiP and PoP configurations. Additionally, the strip level net spacer 100 of the present invention can be placed between stacked PiP and PoP configurations or within PiP and PoP configurations.

It is to be understood that the second semiconductor devices 1200 of the present invention cover a wide range of package and die configurations, and the type of package or die configuration employed is only limited by the design specifications of the integrated circuit package system 400.

Furthermore, it should be noted that the present invention allows for testing of the second semiconductor devices 1200 before adhering them to the strip level net spacer 100, therefore ensuring the use of known good die or packages in the manufacturing process. Additionally, after adhering the second semiconductor devices 1200 to the strip level net spacer 100, these sub-assemblies can also be tested before encapsulation. This ensures that the integrated circuit package system 400 includes known good sub-assemblies, and thereby improves the assembly process yield for packaging.

Referring now to FIG. 13, therein is shown a cross-sectional view of FIG. 12 along line 13-13 in accordance with an embodiment of the present invention. This cross-sectional view depicts the formation of the second semiconductor device 1200 over the paddle 102 of the strip level net spacer 100. From this view, it can be seen that the strip level net spacer 100 will provide structural support for the second semiconductor device 1200. Furthermore, the bottom surface of the second semiconductor device 1200 adjacent the strip level net spacer 100 may include a non-conducting layer 1300 for prevention of electrical shorting with the first wire bonds 900.

Referring now to FIG. 14, therein is shown the structure of FIG. 13 in accordance with another embodiment of the present invention. This cross-sectional view depicts the formation of the second semiconductor device 1200 over the paddle 102 of the strip level net spacer 100. From this view, it can be seen that the adhesive layer 300 will provide additional support to the strip level net spacer 100 and to the second semiconductor device 1200. Just as with FIG. 13, the bottom surface of the second semiconductor device 1200 adjacent the strip level net spacer 100 may include a non-conducting layer 1300 for prevention of electrical shorting with the first wire bonds 900.

Referring now to FIG. 15, therein is shown the structure of FIG. 13 after the formation of second wire bonds 1500, encapsulation material 1502, and external electrical contacts 1504 in accordance with an embodiment of the present invention. The open regions 108 (not shown) of the strip level net spacer 100 allow for the formation of the second wire bonds 1500, whose size and number are only currently limited by the technology of wire bond equipment and the minimum required operating space. The encapsulating material 1502, such as a molding compound, is deposited over the strip level net spacer 100, the substrate 402, the first semiconductor device 404, the first wire bonds 900, the second semiconductor device 1200 and the second wire bonds 1500. The encapsulating material 1502 and molding techniques using it are well known in the art and not repeated herein.

Figure 16:
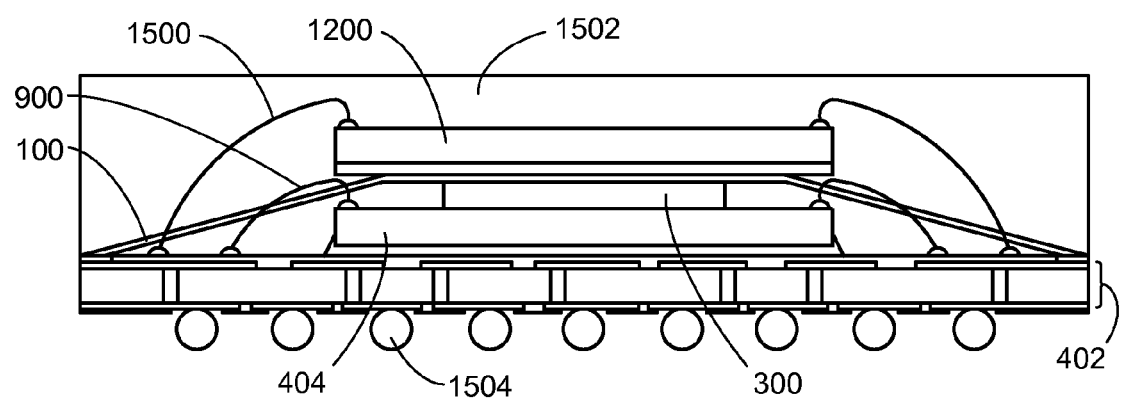
FIG. 16 is the structure of FIG. 14 after the formation of second wire bonds, encapsulation material, and external electrical contacts in accordance with another embodiment of the present invention.

Referring now to FIG. 16, therein is shown the structure of FIG. 14 after the formation of the second wire bonds 1500, the encapsulation material 1502, and the external electrical contacts 1504 in accordance with another embodiment of the present invention. The open regions 108 (not shown) of the strip level net spacer 100 allow for the formation of the second wire bonds 1500, whose size and number are only currently limited by the technology of wire bond equipment and the minimum required operating space. The encapsulating material 1502, such as a molding compound, is deposited over the strip level net spacer 100, the substrate 402, the first semiconductor device 404, the first wire bonds 900, the second semiconductor device 1200 and the second wire bonds 1500. Per this embodiment, the encapsulating material 1502 also covers the adhesive layer 300. The encapsulating material 1502 and molding techniques using it are well known in the art and not repeated herein.

Embodiment Two

FIGS. 17-33 depict an embodiment of the invention wherein the strip level net spacer 100 includes the paddles 102 and the tie bars 104 lying within the substantially same plane.

Figure 17:
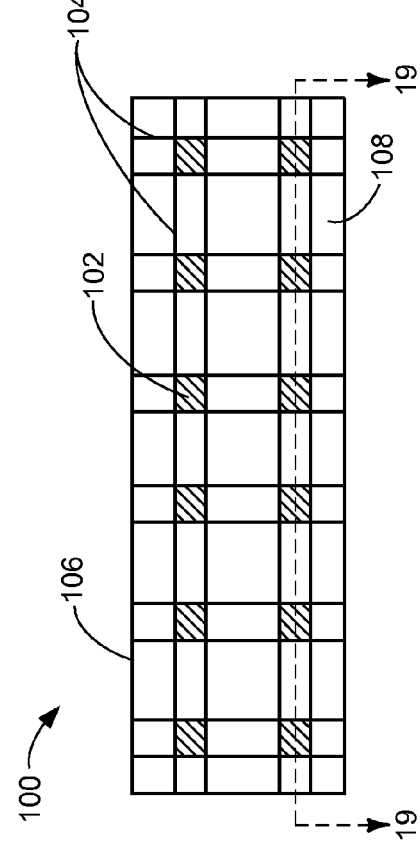
FIG. 17 is a top view of the strip level net spacer in accordance with an embodiment of the present invention.

Referring now to FIG. 17, therein is shown a top view of the strip level net spacer 100 in accordance with an embodiment if the present invention. The strip level net spacer 100 includes the paddles 102, the tie bar 104, the support bars 106, and the open regions 108. The paddles 102 and the tie bars 104 are formed within the substantially same plane. The paddles 102 are connected to the support bars 106 by the tie bars 104. In an embodiment, each of the paddles 102 may include four (4) or more of the open regions 108 formed around each of the paddles 102, wherein some of the open regions 108 are bounded, in part, by the tie bars 104 and the paddles 102. Generally, the support bars 106 can be arranged to bound, in part, less than all of the open regions 108 and, in some embodiments, the support bars 106 can be formed only around the perimeter of the strip level net spacer 100. The open regions 108 provide space for electrical interconnections, such as the first wire bonds 900 (not shown), described further below.

The strip level net spacer 100 can be formed of a plastic material or of a thermally conducting material for purposes of heat dissipation.

Figure 18:
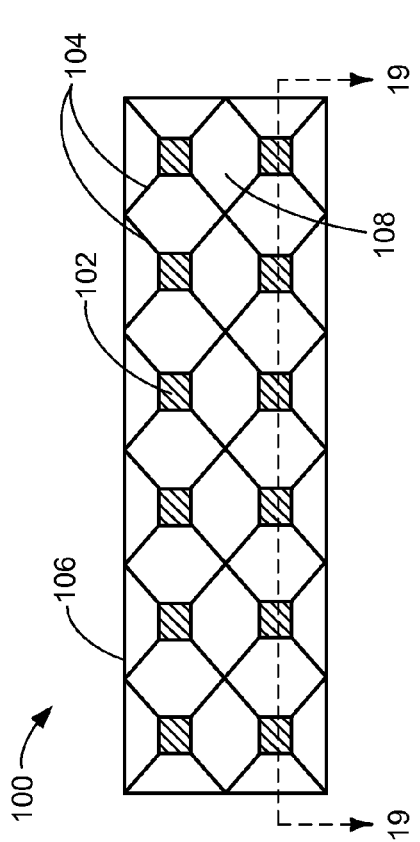
FIG. 18 is a top view of the strip level net spacer in accordance with another embodiment of the present invention.

Referring now to FIG. 18, therein is shown a top view of the strip level net spacer 100 in accordance with another embodiment of the present invention. The strip level net spacer 100 includes the paddles 102, the tie bars 104, the support bars 106, and the open regions 108. The paddles 102 and the tie bars 104 are formed within the substantially same plane. The paddles 102 are connected to the support bars 106 by the tie bars 104. In an embodiment, each of the paddles 102 may include four (4) of the open regions 108 formed around each of the paddles 102, wherein each of the open regions 108 is bounded, in part, by the tie bars 104 and the paddles 102. Generally, the support bars 106 can be arranged to bound, in part less than all of the open regions 108 an in some embodiments, the support bars 106 can be formed only around the perimeter of the strip level net spacer 100. The open regions 108 provide space for electrical interconnections, such as the first wire bonds 900, described further below.

The strip level net spacer 100 can be formed of a plastic material or of a thermally conducting material for purposes of heat dissipation.

Figure 19:
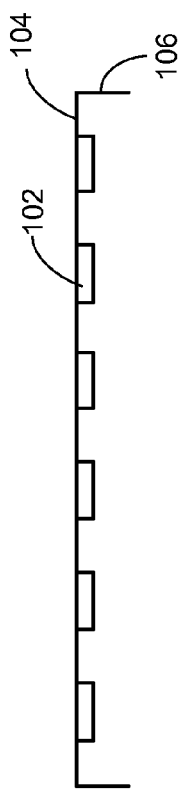
FIG. 19 is a cross-sectional view of either FIG. 17 along line 19-19 or FIG. 18 along line 19-19 in accordance with an embodiment of the present invention.

Referring now to FIG. 19, therein is shown a cross-sectional view of either FIG. 17 along line 19-19 or FIG. 18 along line 19-19 in accordance with an embodiment of the present invention. This cross-sectional view depicts the paddles 102 as solid formations. The paddles 102 are interconnected and connected to the support bars 106 via the tie bars 104.

Figure 20:
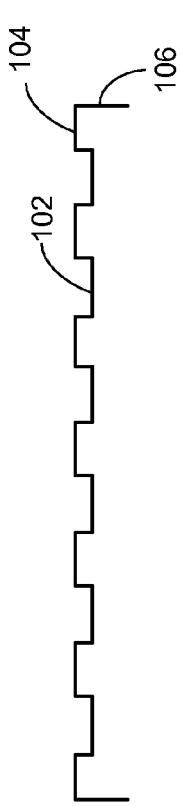
FIG. 20 is the structure of FIG. 19 in accordance with another embodiment of the present invention.

Referring now to FIG. 20, therein is shown the structure of FIG. 19 in accordance with another embodiment of the present invention. This cross-sectional view depicts the paddles 102 as single hollow depressions. The paddles 102 are interconnected and connected to the support bars 106 via the tie bars 104.

Figure 21:
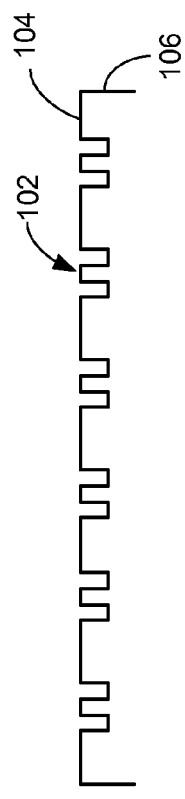
FIG. 21 is the structure of FIG. 19 in accordance with another embodiment of the present invention.

Referring now to FIG. 21, therein is shown the structure of FIG. 19 in accordance with another embodiment of the present invention. This cross-sectional view depicts the paddles 102 as double hollow depressions. The paddles 102 are interconnected and connected to the support bars 106 via the tie bars 104.

FIGS. 22-32 depict an exemplary process flow for the manufacture of the integrated circuit package system 400 employing the strip level net spacer 100 in accordance with an embodiment of the present invention. It is to be understood that FIGS. 22-32 depict by way of example and not by limitation, an exemplary process flow for the formation of the integrated circuit package system 400, and it is not to be construed as limiting.

Referring now to FIG. 22, therein is shown a top view of the integrated circuit package system 400 in accordance with an embodiment of the present invention. The integrated circuit package system 400 includes the substrate 402 and the first semiconductor devices 404. The substrate 402 can be fabricated from ceramics, silicon, silicon based composites, plastics, or laminates of various types (organic or inorganic), which are compatible chemically, thermally, and mechanically with the process conditions chosen for the integrated circuit package system 400 design. As an exemplary illustration, the substrate 402 may include multi-chip modules.

The first semiconductor devices 404 may include semiconductor chips and integrated circuit packages selected from active components, passive components, surface mount components, stacked components, and so forth, in numerous configurations and arrangements as may be needed.

By way of example and not by way of limitation, the first semiconductor devices 404 may more specifically include quad-flat non-leaded packages, wire bond packages, single and dual-side memory packages, internal stacking module packages, flip-chip packages, modular packages, application-specific-integrated-circuit (ASIC) packages, stacked die packages or a combination thereof. Furthermore, the first semiconductor devices 404 may further include, by way of example and not by way of limitation, wire bond die, flip-chip die, stacked die, modular die, ASIC die, passive devices or a combination thereof.

Additionally, the present invention includes semiconductor package configurations, such as package-in-package (PiP) and package-on-package configurations (PoP). The PiP system is a 3D package system that stacks a fully tested Internal Stacking Module (ISM) on top of a Base Assemble Package (BAP) to form a single Chip Scale Package (CSP). PoP is a 3D package in which fully tested packages are stacked on top of another single or stacked package during the board mount process. For example, the first semiconductor devices 404 may include PiP and PoP configurations. Additionally, the strip level net spacer 100 of the present invention can be placed between stacked PiP and PoP configurations or within PiP and PoP configurations.

It is to be understood that the first semiconductor devices 404 of the present invention cover a wide range of package and die configurations, and the type of package or die configuration employed is only limited by the design specifications of the integrated circuit package system 400.

Furthermore, it should be noted that the present invention allows for testing of the first semiconductor devices 404 before adhering them to the substrate 402, therefore ensuring the use of known good die or packages in the manufacturing process. Additionally, after adhering the first semiconductor devices 404 to the substrate 402, these multi-chip modules/sub-assemblies can also be tested before incorporation into the integrated circuit package system 400. This ensures that the integrated circuit package system 400 includes known good sub-assemblies, and thereby improves the assembly process yield for packaging.

Referring now to FIG. 23, therein is shown a cross-sectional view of FIG. 22 along line 23-23 in accordance with an embodiment of the present invention. The cross-sectional view depicts the first semiconductor devices 404 formed over the substrate 402. Electrical conduits 502 provide electrical interconnection between the substrate 402 and the first semiconductor devices 404, with external electrical circuitry.

Referring now to FIG. 24, therein is shown the structure of FIG. 22 after wire bonding of the first semiconductor devices 404. The first wire bonds 900, whose size and number are only currently limited by the technology of wire bond equipment and the minimum required operating space, connect the first semiconductor devices 404 to the substrate 402. Although FIG. 24 depicts the first semiconductor devices 404 connected to the substrate 402 by the first wire bonds 900, the invention is not to be limited to such electrical interconnection. For instance, the first semiconductor devices 404 may be attached to the substrate 402 by flip-chip methods, ball-grid array technology, or other well known surface mount techniques.

Referring now to FIG. 25, therein is shown a cross-sectional view of FIG. 24 along line 25-25 in accordance with an embodiment of the present invention. The integrated circuit package system 400 includes the substrate 402, the first semiconductor devices 404 and the first wire bonds 900.

Referring now to FIG. 26, therein is shown the structure of FIG. 24 after the formation of the strip level net spacer 100. The integrated circuit package system 400 includes the strip level net spacer 100, the substrate 402 and the first semiconductor devices 404. The strip level net spacer 100 overlies the substrate 402, with the paddles 102 substantially centered over each of the first semiconductor devices 404. The support bars 106 rest on the top surface of the substrate 402 and provide structural integrity to the paddles 102 through the tie bars 104. Additionally, the strip level net spacer 100 lends structural support to the substrate 402, thereby preventing warpage of the substrate 402 during subsequent processing.

Although FIG. 26 depicts the strip level net spacer 100 of FIG. 17, it is to be understood that the strip level net spacer 100 of FIG. 18 could be used as well.

Referring now to FIG. 27, therein is shown a cross-sectional view of FIG. 26 along line 27-27 in accordance with an embodiment of the present invention. Per this view, it becomes apparent that the paddle 102 is formed above the plane of the substrate 402, as well as above the first semiconductor device 404. The tie bars 104 extend outward from the paddle 102 and interconnect with the support bars 106, which contact the substrate 402. The strip level net spacer 100 can be attached to the substrate 402 by adhesive techniques well know within the art and are not repeated herein.

Although not shown, the present embodiment may include the adhesive layer 300 formed on the bottom of the paddle 102 for connection to the first semiconductor device 404. The adhesive layer 300 is designed to help support the strip level net spacer 100 from forces encountered during subsequent device attachment or electrical interconnection, such as wire bonding.

Furthermore, although FIG. 27 depicts the strip level net spacer 100 of FIG. 19, it is to be understood that the strip level net spacer 100 of FIGS. 20 and 21 could be used as well.

Referring now to FIG. 28, therein is shown the structure of FIG. 26 after the second semiconductor devices 1200 are formed over the strip level net spacer 100. The second semiconductor devices 1200 are stacked vertically over the first semiconductor devices 404 (not shown). More specifically, the second semiconductor devices 1200 are directly attached to the paddles 102 (not shown) formed over the first semiconductor devices 404 by adhesive materials that are well known within the art. The strip level net spacer 100 provides a stable platform for the second semiconductor devices 1200, which prevents delamination and chip cracking problems.

The second semiconductor devices 1200 may include semiconductor chips and integrated circuit packages selected from active components, passive components, surface mount components, stacked components, and so forth, in numerous configurations and arrangements as may be needed.

By way of example and not by way of limitation, the second semiconductor devices 1200 may more specifically include quad-flat non-leaded packages, wire bond packages, single and dual-side memory packages, internal stacking module packages, flip-chip packages, modular packages, application-specific-integrated-circuit (ASIC) packages, stacked die packages or a combination thereof. Furthermore, the second semiconductor devices 1200 may further include, by way of example and not by way of limitation, wire bond die, flip-chip die, stacked die, modular die, ASIC die, passive devices or a combination thereof.

Additionally, the present invention includes semiconductor package configurations, such as package-in-package (PiP) and package-on-package configurations (PoP). The PiP system is a 3D package system that stacks a fully tested Internal Stacking Module (ISM) on top of a Base Assemble Package (BAP) to form a single Chip Scale Package (CSP). PoP is a 3D package in which fully tested packages are stacked on top of another single or stacked package during the board mount process. For example, the second semiconductor devices 1200 may include PiP and PoP configurations. Additionally, the strip level net spacer 100 of the present invention can be placed between stacked PiP and PoP configurations or within PiP and PoP configurations.

It is to be understood that the second semiconductor devices 1200 of the present invention cover a wide range of package and die configurations, and the type of package or die configuration employed is only limited by the design specifications of the integrated circuit package system 400.

Furthermore, it should be noted that the present invention allows for testing of the second semiconductor devices 1200 before adhering them to the strip level net spacer 100, therefore ensuring the use of known good die or packages in the manufacturing process. Additionally, after adhering the second semiconductor devices 1200 to the strip level net spacer 100, these sub-assemblies can also be tested before encapsulation. This ensures that the integrated circuit package system 400 includes known good sub-assemblies, and thereby improves the assembly process yield for packaging.

Referring now to FIG. 29, therein is shown a cross-sectional view of FIG. 28 along line 29-29 in accordance with an embodiment of the present invention. This cross-sectional view depicts the formation of the second semiconductor devices 1200 over the paddles 102 of the strip level net spacer 100. From this view, it can be seen that the strip level net spacer 100 will provide structural support to the entire area of the second semiconductor devices 1200. The second semiconductor devices 1200 can be attached to the paddles 102 by adhesives well known within the art. Although not shown, the bottom surface of the second semiconductor device 1200 adjacent the strip level net spacer 100 may include a non-conducting layer 1300 for prevention of electrical shorting with the first wire bonds 900.

Referring now to FIG. 30, therein is shown the structure of FIG. 28 after formation of the second wire bonds 1500. The open regions 108 of the strip level net spacer 100 allow for the formation of the second wire bonds 1500, whose size and number are only currently limited by the technology of wire bond equipment and the minimum required operating space.

Referring now to FIG. 31, therein is shown a cross-sectional view of FIG. 30 along line 31-31 in accordance with an embodiment of the present invention. This view depicts the second wire bonds 1500 traversing through the strip level net spacer 100 and attaching to the substrate 402.

Figure 32:
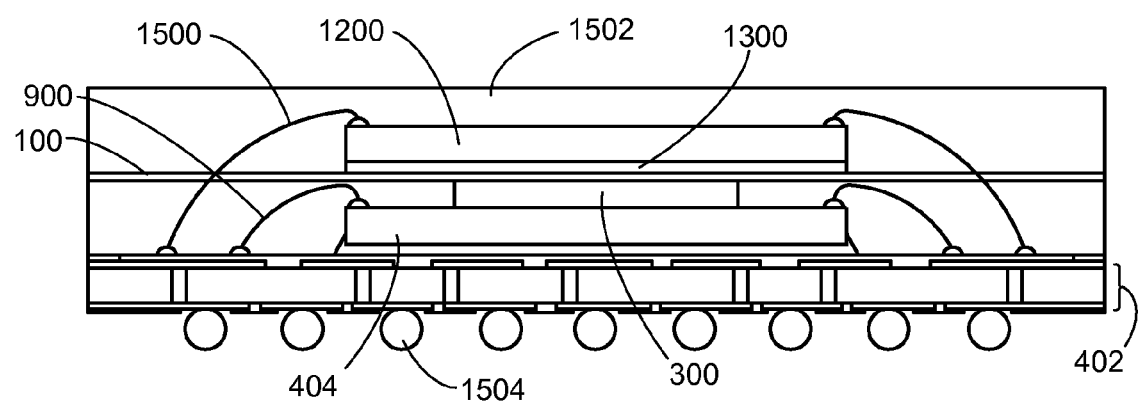
FIG. 32 is the structure of FIG. 31 after formation of the encapsulating material and the external electrical connections.

Referring now to FIG. 32, therein is shown the structure of FIG. 31 after formation of the encapsulating material 1502 and the external electrical connections 1504. This view additionally depicts the formation of the adhesive layer 300 and the non-conducting layer 1300. The encapsulating material 1502, such as a molding compound, is deposited over the strip level net spacer 100, the substrate 402, the first semiconductor device 404, the first wire bonds 900, the second semiconductor device 1200 and the second wire bonds 1500. The encapsulating material 1502 and molding techniques using it are well known in the art and not repeated herein.

Figure 33:
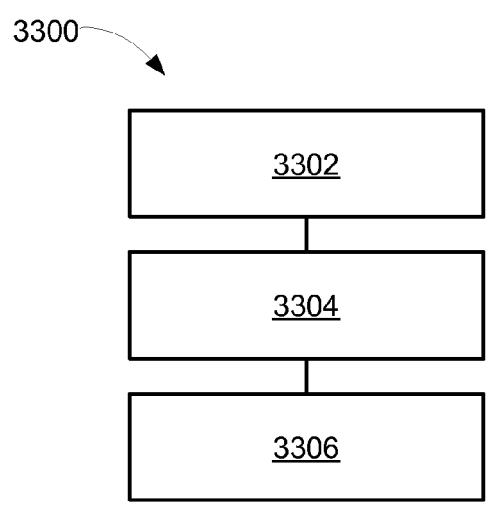
FIG. 33 is a flow chart for an integrated circuit package system for fabricating the integrated circuit package system in accordance with an embodiment of the present invention.

Referring now to FIG. 33, therein is shown a flow chart for an integrated circuit package system 3300 for fabricating the integrated circuit package system 400 in accordance with an embodiment of the present invention. The integrated circuit package system 3300 includes forming a strip level net spacer including support bars, tie bars and paddles in a block 3302; configuring the support bars, the tie bars and the paddles to form four or more open regions around each of the paddles in a block 3304; and interconnecting the support bars, the tie bars and the paddles to provide structural support to vertically stacked semiconductor devices in a block 3306.

It has been discovered that the present invention thus has numerous advantages. A principle advantage is that the overall stack-up height of a vertically stacked integrated circuit package system can be reduced by employing a strip level net spacer.

Another advantage of the present invention is that the number of process steps used in forming a vertically stacked integrated circuit package system can be reduced. Consequently, the time and cost of producing such a system can be reduced.

Yet still, another advantage of the present invention is that the strip level net spacer provides additional structural support to an underlying substrate and thereby prevents warpage of the substrate.

These and other valuable aspects of the present invention consequently further the state of the technology to at least the next level.

Thus, it has been discovered that the integrated circuit system of the present invention furnishes important and heretofore unknown and unavailable solutions, capabilities, and functional advantages. For instance, by employing a strip level net spacer, the overall stack-up height of the package system can be reduced, process steps can be eliminated, and additional structural support is afforded to the package system to prevent substrate warpage failure. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
   forming a strip level net spacer including support bars, tie bars and paddles;
   configuring the support bars, the tie bars and the paddles to form four or more open regions around each of the paddles, the support bars bounding less than all of the open regions; and
   interconnecting the support bars, the tie bars and the paddles to provide structural support to vertically stacked semiconductor devices formed above first semiconductor device and directly attached to the paddles.

2. The method as claimed in claim 1 further comprising:
   providing an adhesive layer of the bottom of the paddles.

3. The method as claimed in claim 1 wherein:
   interconnecting the support bars, the tie bars and the paddles provides structural support to second semiconductor devices formed over first semiconductor devices during attachment and wire bonding.

4. The method as claimed in claim 1 wherein:
   forming the strip level net spacer includes forming the strip level net spacer of plastic or heat dissipating material.

5. The method as claimed in claim 1 further comprising:
   configuring the strip level net spacer to prevent warping of a substrate.

6. A method for manufacturing an integrated circuit package system comprising:
   providing a substrate with first semiconductor devices interconnected to the substrate;
   forming over the substrate a strip level net spacer including paddles used for supporting second semiconductor devices and tie bars which interconnect the paddles to support bars wherein the paddles, the tie bars, and the support bars are configured to form four or more open regions around each of the paddles with the support bars bonding less than all of the open regions; and
   stacking the second semiconductor devices over the first semiconductor devices, the second semiconductor devices directly attached to the paddles.

7. The method as claimed in claim 6 further comprising:
   interconnecting the first semiconductor devices and the second semiconductor devices to the substrate via with bonding.

8. The method as claimed in claim 6 further comprising:
   providing an adhesive layer in the bottom of the paddles for bonding to the first semiconductor device.

9. The method as claimed in claim 6 wherein:
   providing the substrate with the first semiconductor devices includes quad-flat non-leaded packages, wire bond packages, single and dual-side memory packages, internal stacking module packages, flip-chip packages, modular packages, application-specific-integrated-circuit (ASIC) packages, stacked die packages, wire bond die, flip-chip die, stacked die, modular die, ASIC die, passive devices or a combination thereof.

10. The method as claimed in claim 6 wherein:
    providing the second semiconductor devices includes quad-flat non-leaded packages, wire bond packages, single and dual-side memory packages, internal stacking module packages, flip-chip packages, modular packages, application-specific-integrated-circuit (ASIC) packages, stacked die packages, wire bond die, flip-chip die, stacked die modular die, ASIC die, passive devices or a combination thereof.

11. An integrated circuit package system comprising:
    a substrate with a first semiconductor device interconnected to the substrate;
    a strip level net spacer including a paddle and tie bars which interconnect the paddle to support bars, wherein the paddle, the tie bars, and the support bars are configured to form four or more open regions around the paddle with the su ort bars bounding less than all of the open regions; and
    a second semiconductor device over the first semiconductor device and directly attached to the paddle.

12. The system as claimed in claim 11 further comprising:
    an adhesive layer on the bottom of the paddle.

13. The system as claimed in claim 11 wherein:
    the support bars, the tie bars and the paddle provide structural support to the second semiconductor device that prevents delamination and chip cracking.

14. The system as claimed in claim 11 wherein:
    the strip level net spacer is formed of plastic or heat dissipating material.

15. The system as claimed in claim 11 wherein:
    the strip level net spacer prevents warping of a substrate.

16. The system as claimed in claim 11 further comprising:
    the first semiconductor device and the second semiconductor device interconnected to the substrate via wire bonding.

17. The system as claimed in claim 16 wherein:
    the first semiconductor device includes quad-flat non-leaded packages, wire bond packages, single and dual-side memory packages, internal stacking module packages, flip-chip packages, modular packages, application-specific-integrated-circuit (ASIC) packages, stacked die packages, wire bond die, flip-chip die, stacked die modular die, ASIC die, passive devices or a combination thereof.

18. The system as claimed in claim 16 wherein:

the second semiconductor device includes quad-flat non-leaded packages, wire bond packages, single and dual-side memory packages, internal stacking module packages, flip-chip packages, modular packages, application-specific-integrated-circuit (ASIC) packages, stacked die packages, wire bond die, flip-chip die, stacked die, modular die, ASIC die, passive devices or a combination thereof.

19. The system as claimed in claim 16 wherein:
the strip level net spacer includes a plurality of the paddles;
the substrate includes a plurality of the first semiconductor devices; and
the integrated circuit package system includes a plurality of the second semiconductor devices.

20. The system as claimed in claim 16 further comprising:
an adhesive layer on the bottom of the paddle for bonding to the first semiconductor device.

* * * * *

UNITED STATES PATENT AND TRADEMARK OFFICE
CERTIFICATE OF CORRECTION

PATENT NO. : 7,829,986 B2  
APPLICATION NO. : 11/278411  
DATED : November 9, 2010  
INVENTOR(S) : Lee et al.

Page 1 of 1

It is certified that error appears in the above-identified patent and that said Letters Patent is hereby corrected as shown below:

Column 1, line 62, delete "the addles" and insert therefor --the paddles--

Column 4, line 20, delete "tie bar" and insert therefor --tie bars--

Column 8:

line 45, delete "if the" and insert therefor --of the-- line 46, delete "tie bar" and insert therefor --tie bars-- line 47, delete "tic bars" and insert therefor --tie bars--

Column 9, line 9, delete "108 an" and insert therefor --108 and,--

Column 13:

Claim 1, line 44, delete "device" and insert therefor --devices--

Claim 2, line 46, delete "of the" and insert therefor --on the--

Claim 6, line 65, delete "bars wherein" and insert therefor --bars, wherein--

Column 14:

Claim 6, line 2, delete "bonding less" and insert therefor --bounding less--

Claim 7, line 8, delete "via with" and insert therefor --via wire--

Claim 8, line 11, delete "in the" and insert therefor --on the--

Claim 8, line 12, delete "device." and insert therefor --devices.--

Claim 11, line 38, delete "the su ort" and insert therefor --the support--

Signed and Sealed this

Fifteenth Day of February, 2011

David J. Kappos  
*Director of the United States Patent and Trademark Office*